United States Patent
Zhang et al.

(10) Patent No.: US 10,142,419 B2
(45) Date of Patent: Nov. 27, 2018

(54) ERASURE CORRECTING CODING USING DATA SUBSETS AND PARTIAL PARITY SYMBOLS

(71) Applicant: SANDISK TECHNOLOGIES LLC, Plano, TX (US)

(72) Inventors: Xinmiao Zhang, Mercer Island, WA (US); Steven Sprouse, San Jose, CA (US); Ishai Ilani, Dolev (IL)

(73) Assignee: SANDISK TECHNOLOGIES LLC, Addision, TX (US)

( * ) Notice: Subject to any disclaimer, the term of this patent is extended or adjusted under 35 U.S.C. 154(b) by 0 days.

(21) Appl. No.: 15/179,325

(22) Filed: Jun. 10, 2016

(65) Prior Publication Data

US 2017/0255519 A1    Sep. 7, 2017

Related U.S. Application Data

(60) Provisional application No. 62/304,113, filed on Mar. 4, 2016.

(51) Int. Cl.
| | |
|---|---|
| *G06F 11/10* | (2006.01) |
| *H04L 29/08* | (2006.01) |
| *H03M 13/03* | (2006.01) |
| *H03M 13/13* | (2006.01) |
| *H03M 13/35* | (2006.01) |

(Continued)

(52) U.S. Cl.
CPC ...... *H04L 67/1097* (2013.01); *G06F 11/1012* (2013.01); *H03M 13/033* (2013.01); *H03M 13/13* (2013.01); *H03M 13/356* (2013.01); *H03M 13/373* (2013.01); *H03M 13/3761* (2013.01); *H04L 67/10* (2013.01); *H04L 69/40* (2013.01)

(58) Field of Classification Search
CPC ............ G06F 11/1076; G06F 11/1092; H03M 13/154

See application file for complete search history.

(56) References Cited

U.S. PATENT DOCUMENTS

| | | | |
|---|---|---|---|
| 5,377,207 A * | 12/1994 | Perlman | H03M 13/151 714/784 |
| 8,156,405 B1 * | 4/2012 | Lumb | G06F 11/1092 714/770 |
| 8,437,183 B2 | 5/2013 | Sharon et al. | |

(Continued)

OTHER PUBLICATIONS

Pamies-Juarez et al., "Locally repairable codes with multiple repair alternatives," Proc. IEEE Intl. Symp. Info. Theory, 2013, 5 pages.

(Continued)

*Primary Examiner* — Shelly A Chase
(74) *Attorney, Agent, or Firm* — Michael Best & Friedrich LLP

(57) ABSTRACT

In an illustrative example, a method includes receiving data that includes a set of data symbols. The method further includes generating a set of parity symbols based on the set of data symbols using an erasure correcting code. The set of parity symbols includes at least a first parity symbol that is generated based on a first proper subset of the set of data symbols. The first parity symbol enables recovery of a data symbol of the first proper subset independently of a second proper subset of the set of data symbols.

16 Claims, 5 Drawing Sheets

(51) Int. Cl.
*H03M 13/37* (2006.01)
*H04L 29/14* (2006.01)

(56) References Cited

U.S. PATENT DOCUMENTS

| | | | |
|---|---|---|---|
| 8,707,093 B1* | 4/2014 | Sites | G06F 11/1076 714/6.24 |
| 8,856,593 B2 | 10/2014 | Eckhardt et al. | |
| 8,914,706 B2* | 12/2014 | Anderson | G06F 11/1076 714/6.24 |
| 8,918,701 B2 | 12/2014 | Blaum et al. | |
| 9,009,565 B1* | 4/2015 | Northcott | G11C 29/42 365/185.09 |
| 2009/0077449 A1* | 3/2009 | Lee | H03M 13/15 714/785 |
| 2010/0174968 A1 | 7/2010 | Charles et al. | |
| 2013/0031429 A1 | 1/2013 | Sharon et al. | |
| 2016/0211869 A1 | 7/2016 | Blaum et al. | |

OTHER PUBLICATIONS

Rashmi, et al., "A piggybacking design framework for read-and-download-efficient distributed storage codes," Proc. IEEE Intl. Symp. Info. Theory, 2013, 19 pages.
Tamo, et al., "A family of optimal locally recoverable codes," IEEE Trans. on Info. Theory, vol. 60, No. 8, Aug. 2014, 16 pages.
Zeh, et al., "Optimal linear and cyclic locally repairable codes over small fields," IEEE Info. Theory Workshop, 2015, 5 pages.
MacWilliams, F.J. and N. J. A. Sloan, The Theory of Error-Correcting Codes, North Holland Publishing Co., Amsterdam, The Netherlands, vol. 16, 1977, 762 pages.
Zhu et al., On the Speedup of Recovery in Large Scale Erasure-Coded Storage Systems, IEEE, Trans. on Parallel & Distributed Sys., vol. 25, No. 7, pp. 1830-1840 (Year: 2014).

* cited by examiner

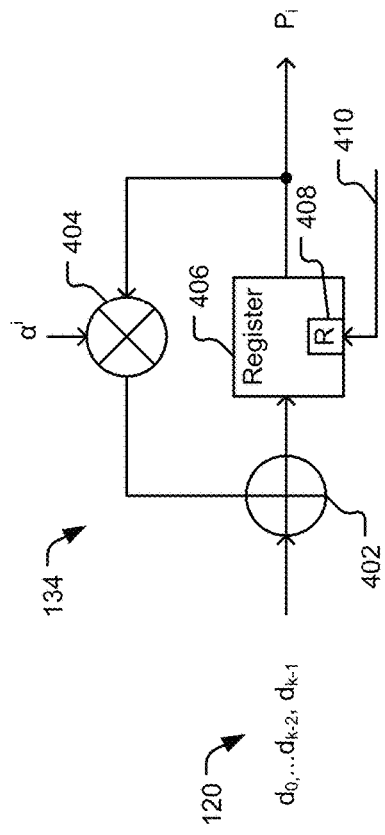

ERASURE CORRECTING CODING USING DATA SUBSETS AND PARTIAL PARITY SYMBOLS

CROSS-REFERENCE TO RELATED APPLICATIONS

The present application claims benefit of U.S. Provisional Application No. 62/304,113, filed Mar. 4, 2016, which is incorporated by reference herein in its entirety.

FIELD OF THE DISCLOSURE

The present disclosure is generally related to electronic devices and more particularly to erasure correcting coding using data subsets for an electronic device.

BRIEF DESCRIPTION OF THE DRAWINGS

FIG. 3 is a diagram illustrating particular aspects of an example of a parity check matrix corresponding to an erasure correcting code and parity splitting schemes associated with the erasure correcting code.

FIG. 4 is another diagram illustrating particular aspects of an example of an encoder configured to encode subsets of data associated with an erasure correcting code.

DETAILED DESCRIPTION

Particular aspects of the disclosure are described below with reference to the drawings. In the description, common or similar features may be designated by common reference numbers. As used herein, "exemplary" may indicate an example, an implementation, and/or an aspect, and should not be construed as limiting or as indicating a preference or a preferred implementation. Although certain examples are described herein with reference to a data storage device, it should be appreciated that techniques described herein are applicable to other implementations. For example, information can be received by a communication device (e.g., wirelessly or from a wired network) alternatively or in addition to accessing information from a memory. Further, it is to be appreciated that certain ordinal terms (e.g., "first" or "second") may be provided for ease of reference and do not necessarily imply physical characteristics or ordering. Therefore, as used herein, an ordinal term (e.g., "first," "second," "third," etc.) used to modify an element, such as a structure, a component, an operation, etc., does not necessarily indicate priority or order of the element with respect to another element, but rather distinguishes the element from another element having a same name (but for use of the ordinal term). In addition, as used herein, indefinite articles ("a" and "an") may indicate "one or more" rather than "one." As used herein, a structure or operation that "comprises" or "includes" an element may include one or more other elements not explicitly recited. Further, an operation performed "based on" a condition or event may also be performed based on one or more other conditions or events not explicitly recited.

Figure 1:
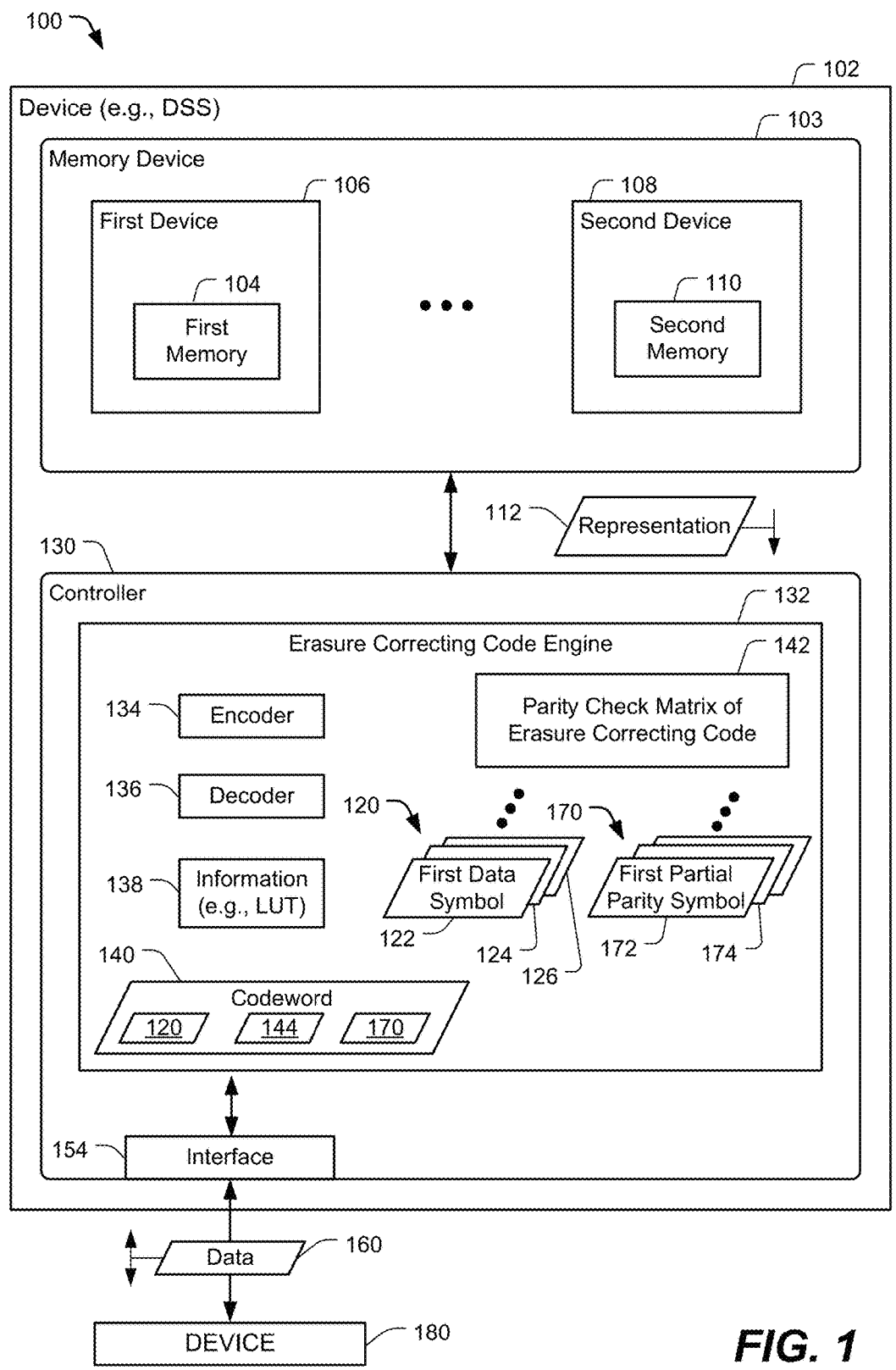
FIG. 1 is a diagram of a particular illustrative example of a system including an erasure correcting code engine that is configured to perform erasure correcting coding using data subsets.

Referring to FIG. 1, a particular illustrative example of system is depicted and generally designated 100. The system 100 includes a device 102 (e.g., a distributed storage system (DSS) or a data storage device) and a device 180 (e.g., an access device that accesses the device 102). The device 102 includes a memory device 103 (e.g., an array of drives) and a controller 130 coupled to the memory device 103. The device 180 may be coupled to the DSS via a wired connection (e.g., a bus or a wired network), a wireless connection, a local area connection (LAN), a wide area connection (WAN), the Internet, or a combination thereof.

The memory device 103 includes multiple devices, such as a first device 106 and a second device 108. An example of a device of the memory device 103 is a memory die. Another example of a device of the memory device 103 is a memory drive, such as a flash memory drive, a resistive memory drive (e.g., a resistive random access memory (ReRAM) drive), a hard disk drive (HDD), or a hybrid HDD. The first device 106 may include a first memory 104 (e.g., a flash memory, a resistive memory, an HDD, or a hybrid HDD, as illustrative examples), and the second device 108 may include a second memory 110 (e.g., a flash memory, a resistive memory, an HDD, or a hybrid HDD, as illustrative examples).

The controller 130 may include an erasure correcting code engine 132 and an interface 154 (e.g., a host interface or an access device interface). The interface 154 is configured to receive data 160 from the device 180 in connection with a request for write access to the memory device 103. The interface 154 is configured to provide the data 160 to the device 180 in connection with a request for read access to the memory device 103. The controller 130 may store information 138, such as a lookup table (LUT).

The erasure correcting code engine 132 may include an encoder 134 and a decoder 136. The erasure correcting code engine 132 is configured to operate based on an erasure correcting code. For example, the encoder 134 is configured to encode the data 160 based on as erasure correcting code associated with a parity check matrix 142. As another example, the decoder 136 is configured to decode data in accordance with parity check equations specified by the parity check matrix 142.

During operation, the controller 130 may receive the data 160 from the device 180. The data 160 may include a set of data symbols 120. In an another example, the controller 130 may generate the set of data symbols 120 based on the data 160, such as by encoding the data 160 based on an error correcting code (ECC), scrambling the data 160, performing one or more other operations, or a combination thereof.

The controller 130 may encode the set of data symbols 120 in accordance with an erasure correcting code. For example, the controller 130 may input the data 160 to the erasure correcting code engine 132 to be encoded by the encoder 134 to generate a codeword 140 of an erasure correcting code associated with the parity check matrix 142. The codeword 140 may include the set of data symbols 120, parity symbols 144 generated based on the set of data symbols 120 in accordance with the erasure correcting code, and a set of "partial" parity symbols 170.

The encoder 134 is configured to generate the set of partial parity symbols 170 based on subsets of the set of data symbols 120 using the erasure correcting code. As used herein, a "subset" refers to a proper subset of a set of elements (i.e., fewer than all elements of the set). The set of partial parity symbols 170 includes a first partial parity symbol 172 (e.g., a first partial parity symbol) that is generated based on a first subset of the set of data symbols 120. For example, the first partial parity symbol 172 may be generated based on a first data symbol 122 of the set of data symbols 120 and further based on a second data symbol 124 of the set of data symbols 120 (e.g., independently of a third data symbol 126 of the set of data symbols 120). The first partial parity symbol 172 enables recovery of a data symbol of the first subset independently of a second subset of the set of data symbols. For example, the first partial parity symbol 172 may enable recovery of the first data symbol 122 after an erasure event associated with the first data symbol 122. As another example, the first partial parity symbol 172 may enable recovery of the second data symbol 124 after an erasure event associated with the second data symbol 124. The second partial parity symbol 174 may be generated based on a different subset of the set of data symbols than the first partial parity symbol 172.

The controller 130 may send the codeword 140 to the memory device 103 to be stored at one or more devices of the memory device 103. For example, the controller 130 may send a write command to cause the memory device 103 to store the codeword 140 to the first device 106, to the second device 108, or a combination thereof. For example, one or more data symbols of the set of data symbols 120 may be stored at a different device of the memory device 103 as compared to one or more other data symbols of the set of data symbols 120, such as by storing the first data symbol 122 to the first device 106 and by storing the second data symbol 124 to the second device 108, as an illustrative example.

The controller 130 may cause the memory device 103 to access a representation of the codeword 140, such as in response to a request for read access from the device 180. The controller 130 may send a read command to cause the memory device 103 to sense data at the memory device 103. As an illustrative example, the controller 130 may send a read command to cause the memory device 103 to sense a representation 112 of the first data symbol 122 (e.g., a version of the first data symbol 122 that may differ from the first data symbol 122 due to one or more errors). The memory device 103 may provide the representation 112 of the first data symbol 122 to the controller 130.

In some circumstances, the controller 130 may detect an erasure event associated with one or more data symbols of the set of data symbols 120. For example, the controller 130 may detect an erasure event associated with the first data symbol 122 in response to failure of the first device 106. In some implementations, the memory device 103 may return an error message to the controller 130 in response to the read command from the controller 130 (instead of providing the representation 112 of the first data symbol 122). In another example, the representation 112 may include corrupted data.

In response to detecting an erasure event associated with the first data symbol 122, the controller 130 may access each other data symbol of the first subset of the set of data symbols 120. For example, since the first subset includes the first data symbol 122 and the second data symbol 124, the controller 130 may send a read command to the memory device 103 to cause the memory device 103 to provide the second data symbol 124 (or a representation of the second data symbol 124) to the controller 130. The controller 130 may also access one or more partial parity symbols of the set of partial parity symbols 170 associated with the first subset, such as the first partial parity symbol 172.

The controller 130 may input the second data symbol 124 and the first partial parity symbol 172 to the erasure correcting code engine 132 to initiate a process to recover the first data symbol 122. For example, the decoder 136 may be configured to recover the first data symbol 122 using the second data symbol 124 and the first partial parity symbol 172 associated with the first subset of data symbols without also accessing the third data symbol 126 and the second partial parity symbol 174. Thus, fewer memory access operations may be performed (e.g., as compared to accessing each portion of the codeword 140). In some cases, if a number of erasures in the first subset of data symbols exceeds an erasure correcting capability of the first partial parity symbol 172, then the third data symbol 126 and the second partial parity symbol 174 may also be accessed to enable enhanced correction capability.

Figure 2:
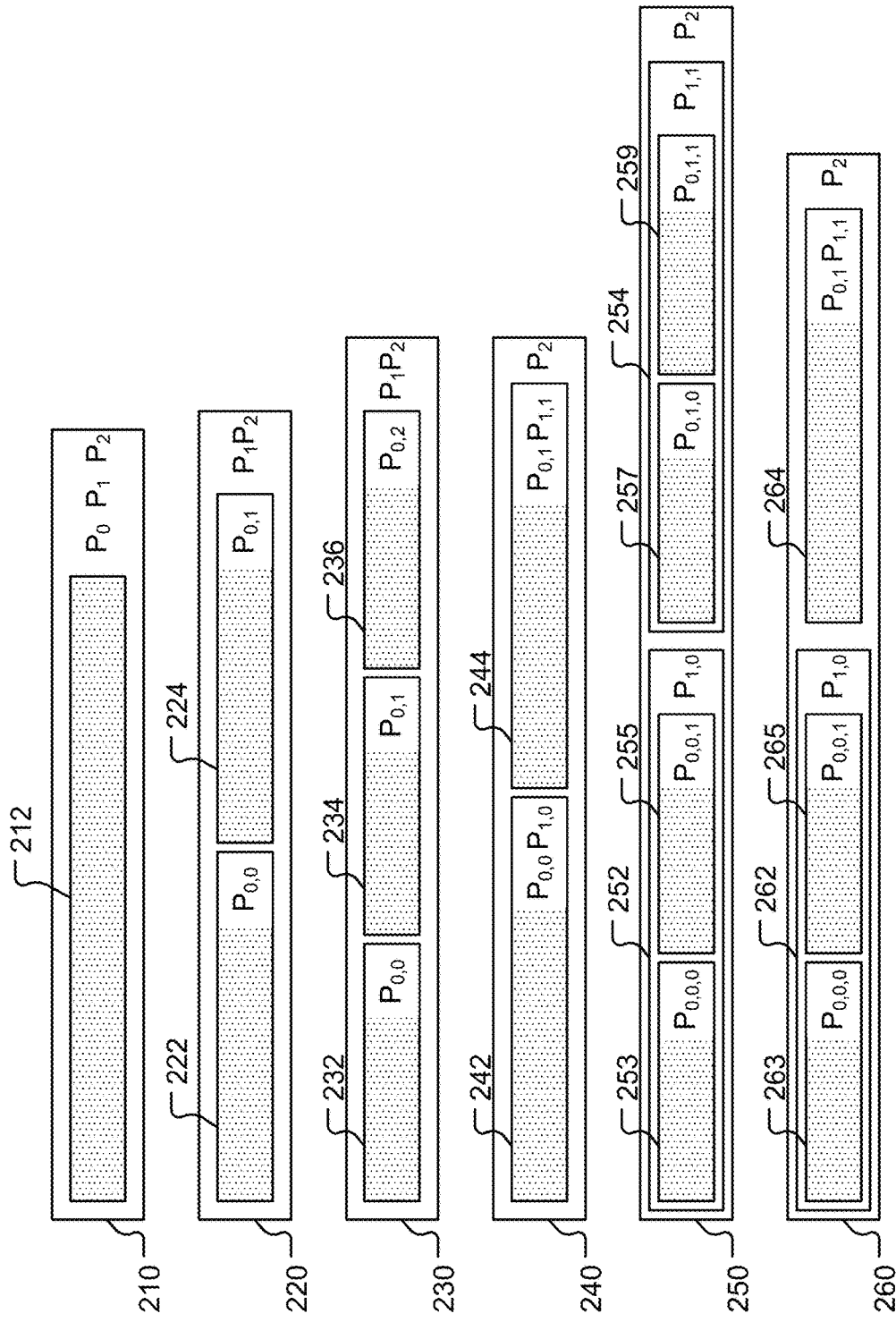
FIG. 2 is a diagram illustrating particular aspects of an example of an erasure correcting code and parity splitting schemes associated with the erasure correcting code.

FIG. 2 depicts particular aspects of an example of an erasure correcting code and parity splitting schemes associated with the erasure correcting code. The erasure correcting code and parity splitting schemes described with reference to FIG. 2 may be used by the controller 130 of FIG. 1. The examples of FIG. 2 correspond to an illustrative t=3 implementation (where t indicates a "maximum" number of erasures correctable using the erasure correcting code). In other examples, t may have a different value. Further, it is noted that the parity splitting schemes depicted in FIG. 2 are illustrative and other parity splitting schemes are also within the scope of the disclosure.

FIG. 2 illustrates an example of a codeword 210 of an erasure correcting code. The codeword 210 may correspond to the codeword 140 of FIG. 1 prior to splitting one or more parity symbols of the parity symbols 144 to generate the set of partial parity symbols 170. For example, the codeword 210 may include a set of data symbols 212 corresponding to the set of data symbols 120 of FIG. 1 and may further include a set of parity symbols $p_0$, $p_1$, and $p_2$ corresponding to the parity symbols 144 of FIG. 1. In other examples, a different number of parity symbols may be used. As an example, in an illustrative t=4 implementation, the codeword 210 may further include a parity symbol $p_3$.

FIG. 2 also depicts a codeword 220 in which a parity symbol $p_0$ of the codeword 210 has been "split" into partial parity symbols $p_{0,0}$ and $p_{0,1}$. The partial parity symbol $p_{0,0}$ may be generated based on a first subset 222 of the set of data symbols 212, and the partial parity symbol $p_{0,1}$ may be generated based on a second subset 224 of the set of data symbols 212.

In other examples, a parity symbol may be split into more than two partial parity symbols. To illustrate, a codeword 230 may include partial parity symbols $p_{0,0}$, $p_{0,1}$, and $p_{0,2}$. The partial parity symbol $p_{0,0}$ may be generated based on a first subset 232 of the set of data symbols 212, the partial parity symbol $p_{0,1}$ may be generated based on a second subset 234 of the set of data symbols 212, and the partial parity symbol $p_{0,2}$ may be generated based on a third subset 236 of the set of data symbols 212.

In some examples, a subset of data symbols may be associated with multiple partial parity symbols, such as if multiple parity symbols of the set of parity symbols $p_0$, $p_1$, and $p_2$ are split. To illustrate, a codeword 240 includes partial parity symbols $p_{0,0}$, $p_{1,0}$, $p_{0,1}$, and $p_{1,1}$. The partial parity symbols $p_{0,0}$ and $p_{0,1}$ may be split from the parity symbol $p_0$, and the partial parity symbols $p_{1,0}$ and $p_{1,1}$ may be split from the parity symbol $p_1$. The partial parity symbols $p_{0,0}$ and $p_{1,0}$ may be associated with a first subset 242 of the set of data symbols 212, and the partial parity symbols $p_{0,1}$ and $p_{1,1}$ may be associated with a second subset 244 of the set of data symbols 212.

Alternatively or in addition, one or more partial parity symbols may be split (e.g., to create partial-partial parity symbols). To illustrate, a codeword 250 may include a partial parity symbol $p_{1,0}$ associated with a first subset 252 and may further include a partial parity symbol $p_{1,1}$ associated with a second subset 254. The partial parity symbols $p_{1,0}$ and $p_{1,1}$ may be split from the parity symbol $p_1$. The codeword 250 may also include a partial-partial parity symbol $p_{0,0,0}$ associated with a first subset 253 and a partial-partial parity symbol $p_{0,0,1}$ associated with a second subset 255. The codeword 250 may further include a partial-partial parity symbol $p_{0,1,0}$ associated with a subset 257 of the second subset 254 and a partial-partial parity symbol $p_{0,1,1}$ associated with a second subset 259 of the second subset 254.

In some examples, "unequal" protection may be applied to data symbols of a codeword. For example, a codeword 260 may include a first subset 262 and a partial parity symbol $p_{1,0}$ associated with the first subset 262. The codeword 260 may also include a partial-partial parity symbol $p_{0,0,0}$ associated with a first subset 263 of the first subset 262 and a partial-partial parity symbol $p_{0,0,1}$ associated with a second subset 265 of the first subset 262. The codeword 260 may further include partial parity symbols $p_{0,1}$ and $p_{1,1}$ associated with a second subset 264. The codeword 260 illustrates an example in which the partial parity symbols $p_{0,1}$ and $p_{1,1}$ are not split into partial-partial parity symbols. Thus, the subsets 262 and 264 may be protected "unequally."

FIG. 3 illustrates an example of the parity check matrix 142 ("H"). In the illustrative example of FIG. 3, t=4. In other cases, t may have a different value. Further, although certain examples herein are described with reference to a Vandermonde matrix, in other implementations, a different systematic H matrix may be used instead of a Vandermonde matrix.

In the example of FIG. 3, the parity check matrix 142 includes a first set of columns ("A") associated with data symbols $d_0$, $d_1$, $d_2$, $d_3$, $d_4$, $d_5$, $d_6$, $d_7$, $d_8$, $d_9$, $d_{10}$, and $d_{11}$ (e.g., the data symbols 120 of FIG. 1) and further includes a second set of columns (an identity matrix, "I") associated with parity symbols $p_0$, $p_1$, $p_2$, and $p_3$. Each entry of the first set of columns includes an exponentiation of a coefficient (e.g., $\alpha^0=1$, $\alpha^1=\alpha$, $\alpha^2$, etc.).

The example of FIG. 3 indicates that the data symbols $d_{0-11}$ may be divided into subsets in multiple levels. Each level of division is represented by one or more groups covering the same number of rows, but different columns of the parity check matrix 142. To illustrate, a first level division of data set is illustrated by two groups covering the first three rows of the parity check matrix 142, a second level division of data subset is indicated by the groups covering the first two rows of the parity check matrix, and a third level division of data subset is shown by the groups covering the first row of the parity check matrix. In other cases, data subset division may be performed differently than as illustrated in the example of FIG. 3.

A particular subset of the data symbols $d_0$-$d_{11}$ and a particular level of the parity check matrix 142 may define a group of coefficients of the parity check matrix 142. For example, a subset $d_0$-$d_5$ and a first level may define a group 312. As another example, a subset $d_6$-$d_{11}$ and the first level may define a group 314. A subset $d_0$-$d_2$ and the second level may define a group 316, and a subset $d_3$-$d_5$ and the second level may define a group 318. A subset $d_6$-$d_9$ and the second level may define a group 320, and a subset $d_{10}$-$d_{11}$ and the second level may define a group 322.

FIG. 4 depicts an illustrative example of the encoder 134. The encoder 134 may include an adder circuit 402, a multiplier circuit 404, and a register 406 coupled to the adder circuit 402 and to the multiplier circuit 404. The encoder 134 of FIG. 4 may correspond to a Vandermonde matrix implementation of the parity check matrix 142. It should be appreciated that the example of FIG. 4 is illustrative and that other implementations are within the scope of the disclosure. For example, the encoder 134 may have a different configuration, such as if a systematic parity check matrix other than using a Vandermonde matrix is implemented as the parity check matrix 142.

The adder circuit 402 may be configured to receive a first subset of a set of data symbols, such as the set of data symbols 120 of FIG. 1. In the example of FIG. 4, the set of data symbols 120 includes data symbols $d_0$, . . . $d_{k-2}$, $d_{k-1}$. The multiplier circuit 404 may be configured to receive exponentiations of coefficients (e.g., $\alpha^i$) of the parity check matrix 142 of FIG. 1.

The register 406 may be configured to receive a reset signal 410 to reset a state of the register 406 prior to processing of a second subset of the set of data symbols by the adder circuit 402 to enable separate encoding of multiple subsets of the set of data symbols 120. For example, a reset input 408 of the register 406 may be configured to receive the reset signal 410 to reset the state of the register 406 to initialize the register 406 for processing of the second subset of the set of data symbols 120. The register 406 may be further configured to output a first parity symbol $p_i$ associated with the first subset. For example, to encode subsets associated with the second level of FIG. 3, the reset signal 410 may be applied after receiving (or processing) the data symbol $d_2$ at the encoder 134, after receiving (or processing) the data symbol $d_5$ at the encoder 134, and after receiving (or processing) the data symbol $d_9$ at the encoder 134 to enable generation of partial parity symbols for the groups 316, 318, 320, and 322.

Figure 5:
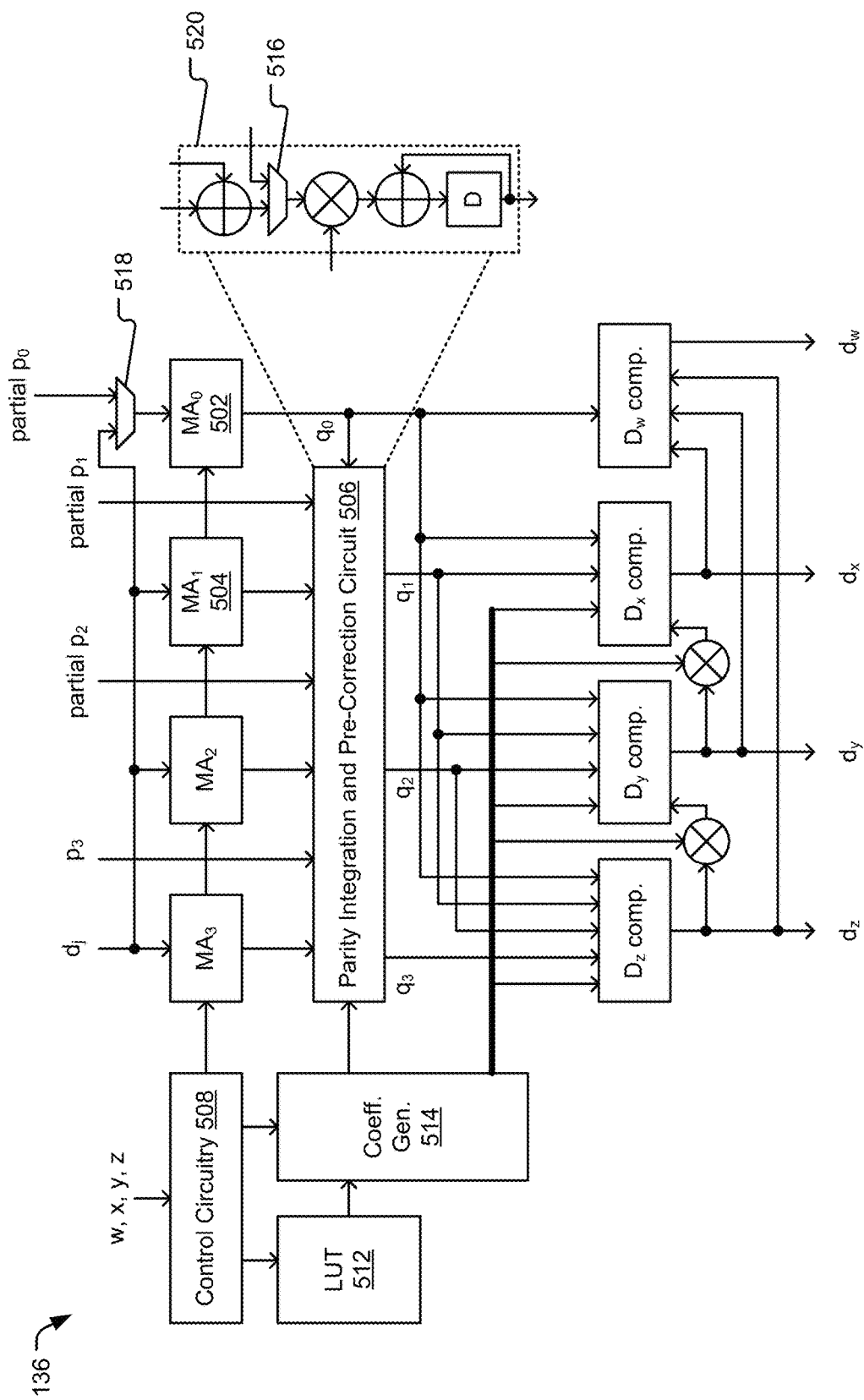
FIG. 5 is a diagram illustrating particular aspects of an example of a decoder configured to recover one or more data symbols associated with an erasure correcting code.

FIG. 5 depicts an illustrative example of the decoder 136. The decoder 136 of FIG. 5 may correspond to a Vandermonde matrix implementation of the parity check matrix 142. It should be appreciated that the example of FIG. 5 is illustrative and that other implementations are within the scope of the disclosure. For example, the decoder 136 may have a different configuration, such as if a systematic parity check matrix other than using a Vandermonde matrix is implemented as the parity check matrix 142.

The decoder 136 may include a set of multiply-add (MA) circuits, such as a first MA circuit 502 and a second MA circuit 504. The decoder 136 also includes a parity integration and pre-correction circuit 506 coupled to the set of MA circuits. The decoder 136 may also include control circuitry 508, a lookup table (LUT) 512, and a coefficient generator 514. The LUT 512 may correspond to the information 138 of FIG. 1. An MA circuit illustrated in FIG. 5 may correspond to the encoder 134 of FIG. 4 (e.g., an MA circuit of FIG. 5 may include an adder circuit, a multiplier circuit, and a register, such as illustrated in the example of FIG. 4).

The first MA circuit 502 may be configured to receive a first data symbol and to generate a first output based on the first data symbol. The second MA circuit 504 may be configured to receive the first data symbol and to generate a second output based on the first data symbol. The parity integration and pre-correction circuit 506 is configured to update the second output based on the first output. For example, the parity integration and pre-correction circuit 506 may include a multiplexer (MUX) 516 configured to select a corrected data value from the first output and to update the second output by inserting the corrected data value at the second output. The MUX 516 may be included in a circuit 520 of the parity integration and pre-correction circuit 506, and the parity integration and pre-correction circuit 506 may include multiple copies of the circuit 520 each coupled to a corresponding MA circuit of the decoder 136.

The decoder 136 may also include a MUX 518 coupled to the first MA circuit 502. The MUX 518 may be configured to select one of a data value and a partial parity symbol and to provide the data value or the partial parity symbol to the first MA circuit 502.

Figure 6:
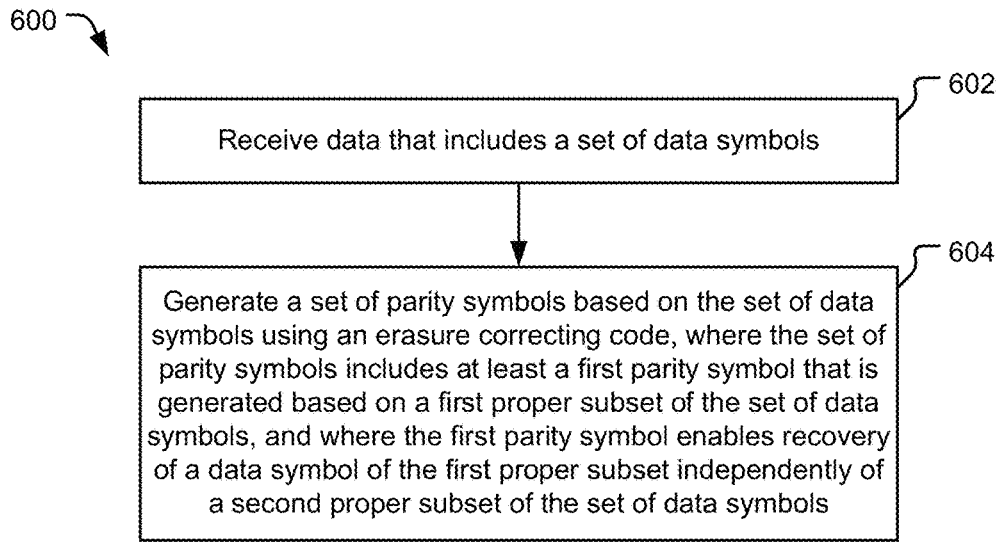
FIG. 6 is a flow chart of an illustrative example of a method of encoding data subsets to generate partial parity symbols associated with an erasure correcting code.

Referring to FIG. 6, a particular illustrative example of a method is depicted and generally designated 600. The method 600 may be performed at a device, such as at the device 102 of FIG. 1.

The method 600 includes receiving data that includes a set of data symbols, at 602. The data may correspond to the data 160 of FIG. 1 or a version of the data 160 that is generated by the controller 130 based on the data 160, and the set of data symbols may correspond to the set of data symbols 120 of FIG. 1, as illustrative examples.

The method 600 further includes generating a set of parity symbols based on the set of data symbols using an erasure correcting code, at 604. The set of parity symbols includes at least a first parity symbol that is generated based on a first subset of the set of data symbols, and the first parity symbol enables recovery of a data symbol of the first subset independently of a second subset of the set of data symbols. To illustrate, the set of parity symbols may correspond to the set of partial parity symbols 170 of FIG. 1, and the first parity symbol may correspond to the first partial parity symbol 172 of FIG. 1. The first subset may correspond to a subset of the set of data symbols 120, such as the data symbols 122 and 124, as an illustrative example. In this example, the second subset may include the third data symbol 126, one or more other data symbols, or a combination thereof. Each data symbol of the second subset may be excluded from the first subset.

The first parity symbol and at least a second parity symbol of the set of parity symbols may correspond to partial parity symbols of a particular parity symbol associated with the erasure correcting code. As illustrative, non-limiting examples, FIGS. 2 and 3 illustrate that the parity symbol $p_0$ may be split to form the partial parity symbols $p_{0,0}$ and $p_{0,1}$, the partial parity symbols $p_{0,0}$, $p_{0,1}$, and $p_{0,2}$, the partial parity symbols $p_{0,0,0}$, $p_{0,0,1}$, $p_{0,1,0}$, and $p_{0,1,1}$, or the partial parity symbols $p_{0,0,0}$, $p_{0,0,1}$, and $p_{0,1}$. Alternatively or in addition, the parity symbol $p_1$ may be split to form the partial parity symbols $p_{1,0}$ and $p_{1,1}$, as depicted with reference to FIGS. 2 and 3. Alternatively or in addition, the parity symbol $p_2$ may be split to form partial parity symbols associated with the groups 312, 314 of FIG. 3.

The set of parity symbols may further include a second parity symbol (e.g., the second partial parity symbol 174) that is generated based on a third subset of the set of data symbols. In some examples, the third subset is included in the first subset. To illustrate, the subsets 253, 255 are included in the first subset 252, and the subsets 257, 259 are included in the second subset 254. As another example, the subsets 263, 265 are included in the first subset 262. To further illustrate, FIG. 3 depicts that the groups 316, 318 are included in the group 312. In other examples, the third subset is larger than the first subset. In another example, the first subset may be the same as the third subset (i.e., the first subset and the third subset may include the same data symbols in some cases).

In some examples, the first subset and the third subset are associated with different levels (e.g., different sets of one or more rows) of the parity check matrix 142. To illustrate, the subsets 253, 255, 257, and 259 are associated with a different level as compared to the subsets 252, 254. As another example, the subsets 263, 265 are associated with a different level as compared to the first subset 262. To further illustrate, FIG. 3 depicts that the groups 316, 318 are associated with a different level as compared to the group 312. Each of the groups 316, 318 also includes one or more subsets that are associated with a different level as compared to the groups 316, 318. In other examples, the third subset is associated with a common level (e.g., a common set of one or more rows) of the parity check matrix 142.

A cardinality of the first subset may be the same as a cardinality of the third subset. In this case, a number of data symbols of the first subset corresponds to a number of data symbols of the third subset. In other examples, a cardinality of the first subset is different than a cardinality of the third subset.

The method 600 may optionally include dividing the data into multiple subsets associated with different levels, where the multiple subsets include the first subset and the second subset. For example, the controller 130 may divide the set of data symbols 120 into multiple subsets, such as the first subset, the second subset, and the third subset.

The method 600 may optionally include generating an erasure correcting codeword based on the first subset and the second subset, such as by generating the codeword 140. The method 600 may optionally include sending the set of data symbols and the set of parity symbols to one or more devices of a DSS. For example, the controller 130 may send the codeword 140 to the memory device 103 for storage at one or more devices of the memory device 103.

Figure 7:
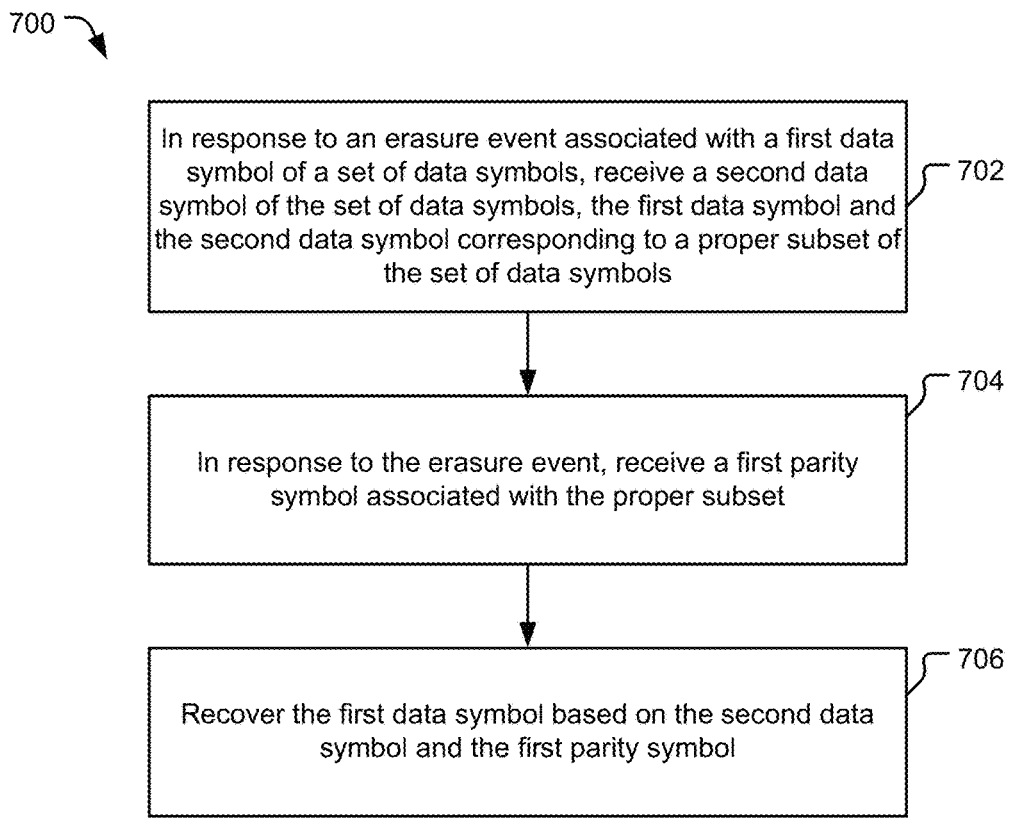
FIG. 7 is a flow chart of an illustrative example of a method of decoding data using partial parity symbols associated with an erasure correcting code.

Referring to FIG. 7, a particular illustrative example of a method is depicted and generally designated 700. The method 700 may be performed at a device, such as at the device 102 of FIG. 1.

The method 700 includes receiving a second data symbol of a set of data symbols in response to an erasure event associated with a first data symbol of the set of data symbols, at 702. The first data symbol and the second data symbol correspond to a proper subset of the set of data symbols. To illustrate, the controller 130 may receive the second data symbol 124 in response to an erasure event associated with the first data symbol 122, as described with reference to FIG. 1. The first data symbol 122 and the second data symbol 124 may be associated with a proper subset of the set of data symbols 120 (e.g., the first subset described with reference to FIG. 1).

The method 700 further includes receiving a first parity symbol associated with the proper subset, at 704. For example, the controller 130 may receive the first partial parity symbol 172, and the first partial parity symbol 172 may be associated with a proper subset of the set of data symbols 120 (where the proper subset includes the first data symbol 122 and the second data symbol 124).

The method 700 further includes recovering the first data symbol based on the second data symbol and the first parity symbol, at 706. For example, recovering the first data symbol may include performing an exclusive-or (XOR) operation based at least in part on the second data symbol and the first parity symbol by the parity integration and pre-correction circuit 506. The XOR operation may be based further on an exponentiation of a coefficient of the parity check matrix 142 (e.g., for partial parity values of $p_1$ and partial parity values of $p_2$).

In an illustrative example, the second data symbol is further associated with a second proper subset of the set of data symbols, and the method 700 further includes receiving a third data symbol associated with the second proper subset prior to recovering the first data symbol and receiving a second parity symbol associated with the second proper subset prior to recovering the first data symbol. In this example, the method 700 may also include recovering the second data symbol based on the third data symbol and the second parity symbol. As an illustrative example, a particular data symbol of the second subset 254 may be recovered (e.g., in response to an erasure event of the particular data symbol) based on other data symbols of the second subset 254 and further based on the partial parity symbol $p_{1,1}$. If the particular data symbol is included in a smaller subset that is within the second subset 254 (e.g., the subset 257 or the subset 259), then the third data symbol and the second parity symbol may be selected based on the smallest subset that includes the particular parity symbol (e.g., by using the subset 257 and the partial parity value $p_{0,1,0}$, or the subset 259 and the partial parity symbol $p_{0,1,1}$ instead of using the second subset 254 and the partial parity symbol $p_{1,1}$).

The method 700 may optionally include accessing information in response to the erasure event to determine that the first data symbol is associated with the second data symbol. For example, the information may correspond the information 138, the LUT 512, or both. The information may indicate a mapping of data symbols to subsets or boundaries of subsets of data symbols (e.g., that the data symbols $d_0$ and $d_5$ form boundaries of a subset associated with the first level, as depicted in the example of FIG. 3).

The information may indicate that the first data symbol is included in multiple subsets of the set of data symbols, and the method 700 may include selecting the second data symbol in response to determining that the subset is of a lower cardinality than other subsets of the multiple subsets. For example, if the second data symbol is included in the subset 257 (and the second subset 254), then the controller 130 may select the subset 257 instead of the second subset 254 in response to determining that the subset 257 is of a lower cardinality of the second subset 254.

Erasure codes may be adopted to achieve reliable data storage. For large-scale distributed storage, besides redundancy, locality (e.g., the number of data and parity symbols accessed for failure recovery) may be reduced to increase data availability, lower network traffic, and reduce recovery latency. Aspects in accordance with the present disclosure describes may enable a flexible and low-complexity scheme for local erasure recovery. A code in accordance with the disclosure may have a reduced number of constraints associated with locality and/or a reduced number of parameters of the code as compared to certain other locally recoverable codes. The code may enable an easy tradeoff on the locality and redundancy and may achieve unequal protection over drives with different reliability. In addition, a code in accordance with the disclosure may feature a reduced computational overhead as compared to other erasure codes that do not support local recovery when the erasure-correction capability is relatively small (such as 2, 3 or 4).

Cloud computing and big data applications may use distributed storage system that can recover from several failures. Erasure codes may be used to recover from failures. In addition to redundancy, locality in terms of the number of symbols to access to recover erasures may affect data availability, network traffic, recovery latency for large-scale distributed systems.

Certain systems use Reed-Solomon (RS) codes, EVENODD codes, and other similar array codes for addressing disk failures. These codes may be maximum distance separable (MDS) codes, and they may feature a relatively small amount of redundancy as compared to certain other codes. In these codes, for an (n, k) code, k symbols may be used for recovery (regardless of the actual erasure number). In most cases, there are fewer failures than the designed "maximum" correction capability t. To improve the locality in these cases, diagonal parities may be used to reduce the number of symbols used to recover from a single failure in EVENODD codes by around ¼. As in certain classical EVENODD codes, this scheme has t=2, and the applicable n and k may be limited. Rotated RS and piggybacking frameworks may spread symbols across multiple stripes of existing codes and may correspond to MDS codes (if the underlying codes are MDS). These codes may be associated with certain constraints on the code parameters, and locality improvement of these codes may depend on the positions of the failed disks. Certain other codes may use expensive polynomial evaluation and interpolation over finite fields for encoding and decoding.

A technique in accordance with the disclosure uses a flexible yet low-complexity scheme for local erasure recovery using systematic parity check matrices of maximum distance separable (MDS) codes. Data symbols may be divided into multiple levels of subsets. The subsets in upper levels may be appended with more parities and hence may address more erasures. In an illustrative example, to recover from failures, only the symbols in the smallest subset with sufficient erasure-correction capability are used for recovery. As a result, significant locality reduction may be achieved. Although a code in accordance with the disclosure may not be MDS, such a code may not be associated with constraints on the code parameters and may not be associated with constraints on the cardinalities of the subsets (and hence locality reduction). Further, the subsets in the same level can be of different sizes. This aspect may enable unequal protection over heterogeneous drives with different reliability. A tradeoff on the locality and redundancy may be achieved through adjusting the number of levels of the subsets and cardinalities of the subsets.

An erasure-correction capability to be achieved in connection with certain systems may be relatively small, such as 2, 3 or 4, and a code in accordance with the disclosure may use Vandermonde matrices to generate parities. The Vandermonde matrices may enable efficient encoder and decoder implementations. For example, erasure recovery may be performed based on linear equations, which may be associated with a lower complexity than certain erasure-only Berlekamp-Massey Algorithm (BMA) techniques for RS decoding.

A minimum distance of an (n, k) linear block code may be at most n−k+1. When this bound is achieved, the code may be referred to as MDS, and a MDS code may be t=n−k erasure-correcting. Linear block codes may be defined by a parity check matrix H. A systematic parity check matrix H may have a format of H=[A|I]. A may be an (n−k)×k matrix, and I may be an (n−k)×(n−k) identity matrix. The corresponding codewords may include data symbols followed by parity symbols. A code corresponding to such a parity check matrix may be MDS if and only if each square submatrix formed by any i rows and any i columns for any i=1, 2, . . . , min{k, n−k} of A is nonsingular. A matrix that satisfies this condition is the Cauchy matrix, in which the entries are $1/(x_i, y_j)$, where $(x_i)$ and $(y_j)$ are sequences of distinct finite field elements, and where $x_i \neq y_j$ for $0 \leq i < (n-k)$ and $0 \leq j < k$. In some circumstances, encoding and decoding according to this matrix may have relatively high complexity. In some implementations, individual drives may be sufficiently reliable so that a large number of failures is relatively unlikely. If the erasure-correction capability, t, is relatively small (e.g., 2, 3, or 4), the Vandermonde matrix may be used as the A matrix for constructing MDS codes in order to simplify an encoder and a decoder. Such a parity check matrix for t-erasure correction may have the format $$H_t^{(V)} = [A_k^{(V)} | I] = \begin{bmatrix} 1 & 1 & \cdots & 1 & 1 & 0 & \cdots & 0 \\ \alpha^0 & \alpha^1 & \cdots & \alpha^{k-1} & 0 & 1 & \cdots & 0 \\ \alpha^0 & \alpha^2 & \cdots & \alpha^{2(k-1)} & 0 & 0 & \cdots & 0 \\ \vdots & \vdots & \ddots & \vdots & \vdots & \vdots & \ddots & 0 \\ \alpha^0 & \alpha^{(t-1)} & \cdots & \alpha^{(t-1)(k-1)} & 0 & 0 & \cdots & 1 \end{bmatrix}$$

where $\alpha$ may indicate a primitive element of a finite field $GF(2^r)$ ($k \leq 2^r - 1$). Since $\alpha^i \neq \alpha^j$ and $\alpha^{2i} \neq \alpha^{2j}$ for $i \neq j$, all square submatrices in $A_2^{(V)}$ and $A_3^{(V)}$ are nonsingular. Hence, $H_2^{(V)}$ and $H_3^{(V)}$ may correspond to parity check matrices of MDS codes with t=2 and t=3, respectively, whose k can be any value less than $2^r$. $H_2^{(V)}$ and $H_3^{(V)}$ may correspond to the parity check matrices for a RAID-6 and triply-extended RS code. For Vandermonde matrices with four or more rows, a maximum number of columns in which there is no singular square submatrices may correspond to the maximum k of the MDS codes that can be constructed. The maximum k may depend on $\alpha$ or the primitive polynomial of which it is a root. For $GF(2^8)$, the maximum k may be 27 for 4-erasure correction, and this value may be increased to 67 if the code is constructed over $GF(2^{10})$. The maximum k may be less for larger t since a Vandermonde matrix with more rows is more likely to have singular submatrices.

A flexible scheme in accordance with the disclosure may use a fraction of the codeword symbols for recovery in cases in which the erasure number is smaller than t. The scheme may be applied to any systematic parity check matrix, such as a scheme that uses a Cauchy matrix. In some circumstances, use of the Vandermonde matrix may result in lower complexity encoding and decoding.

H=[A|I] may correspond to a parity check matrix of a (k+t, k) MDS code, which is t-erasure-correcting. The entries of A may be indicated as $a_{i,j}$ ($0 \leq i < t$, $0 \leq j < k$), the data symbols may be indicated by $d_0, d_1, \ldots, d_{k-1}$, and the parity symbols may be indicated by $p_0, p_1, \ldots, p_{t-1}$. In this example, $$p_i = \sum_{j=0}^{k-1} a_{i,j} d_j, \qquad \text{(Equation 1)}.$$

In certain conventional devices, if one erasure occurs associated with location j, data symbol $d_j$ may be recovered based on:

$$p_0 + \sum_{j'=0, j' \neq j}^{k-1} a_{0,j'} d_{j'}.$$

Such a device may access each of the other data symbols and $p_0$. In response to i erasures, recovery may be performed based on i linear equations specified by the first i rows of H using the other data symbols and $p_0, p_1, \ldots p_{i-1}$. Locality may be defined as a number of symbols (including data symbols and parity symbols) accessed to in order to recover symbols of a particular number of erasures. In certain conventional devices, locality may be k-i+i=k regardless of the number of erasures.

If H is the parity check matrix of a (k+t, k) MDS code, then any k'<k columns of A and I (where I includes t rows and t columns) form the parity check matrix of a (k'+t, k') MDS code, which is t-erasure-correcting. Therefore, instead of involving all data symbols in each parity, the data symbols may be divided into subsets, and parities may be generated for each subset to achieve local erasure recovery. Such a technique may include "breaking up" a code into independent pieces and generating t parities for each subset, which causes large storage overhead. Further, most instances of failures may include a relatively small number of erasures (e.g., much smaller than t). In this case, the failures may be recovered based on fewer linear equations involving fewer rows of H. Accordingly, subset division and parity padding may be performed in a hierarchical manner.

To enable t-erasure correction, all data symbols may be included in the $p_{t-1}$ parity. Further, $p_0, p_1, \ldots, p_{t-2}$ may be "split" into partial parities, and each partial parity may be generated based on a subset of the data symbols. If the k data symbols are divided into $l_0$ subsets $S_j$ ($0 \leq j < l_0$), then $p_i$ ($0 \leq i < t-2$) may be split into $p_{i,0}, p_{i,1} \ldots p_{i,l_0-1}$. $P_{i,j}$ may be determined based on the first i+1 rows of H in the columns corresponding to the subset $S_j$. Since any columns in the first t-1 rows of A padded with $I_{(t-1)\times(t-1)}$ may form the parity check matrix of a code with a minimum distance t, then t-1-erasure correction may be facilitated for the data symbols in $S_j$ using $p_{0,j}, p_{1,j}, \ldots, p_{t-2,j}$. If $p_i$ (i=0, 1, . . . , t-2) are needed for t-erasure correction, $p_i$ may be generated by determining a sum of the partial parities based on:

$$p_i = \sum_{j=0}^{l_0-1} p_{i,j}.$$

Further, $S_j$ may be further divided into $1_{1,j}$ subsets $S_{1,j}$ ($0 \leq m \leq l_{1,j}$), and $p_{i,j}$ ($0 \leq i < t-3$) may be further split into $p_{i,j,m}$ (m=0, 1, . . . , $1_{1,j-1}$). The data symbols in $S_{j,m}$ and the t-2 parities $p_{i,j,m}$ ($0 \leq i \leq t-3$) may be t-2-erasure-correcting. $P_{i,j,m}$ may be summed to recover $p_{i,j}$ for correcting more erasures. This parity splitting process may be iterated. A device in accordance with the disclosure may include circuitry configured to generate the partial parities, to use the partial parities for erasure recovery, or both.

In some examples, redundancy and locality may be "tuned" by changing the number of levels and cardinalities of the subsets. Smaller subsets may be associated with reduced locality and also with more subsets (and more parities). Advantageously, cardinalities of the subsets in a particular level may be unequal. For example, one or more data symbols with higher failure probabilities may be allocated more parities to increase protection as compared to one or more data symbols with lower failure probabilities.

FIG. 2 shows examples of a parity splitting scheme for t=3. In FIG. 2, shaded areas indicate data symbols, and parities within a rectangle are generated for data symbols in the same rectangle. For each example of FIG. 2, Table 1 lists illustrative redundancy and locality in terms of the number of symbols accessed to recover all erasures (assuming the erasures are on the data symbols).

TABLE 1

| | # of parties | locality for correcting | | |
|---|---|---|---|---|
| | | 1 erasure | 2 erasures | 3 erasures |
| (a) | 3 | k | k | k |
| (b) | 4 | k/2 | k | k |
| (c) | 5 | k/3 | 2k/3 (1, 1) | k |
| | | | k (2, 0) | |
| (d) | 5 | k/2 | k/2 (2, 0) | k |
| | | | k (1, 1) | |
| (e) | 7 | k/4 | k/2 | k/2 (2, 1, 0, 0) |
| | | | | 3k/4 (1, 1, 1, 0) |
| | | | | 3k/4 (2, 0, 1, 0) |
| | | | | k (3, 0, 0, 0) |
| (f) | 6 | k/3 | k/3 (0, 0, 2) | 2k/3 (2, 1, 0) |
| | | | 2k/3 (1, 0, 1) | 2k/3 (1, 0, 2) |
| | | | 2k/3 (1, 1, 0) | k (1, 1, 1) |
| | | | 2k/3 (2, 0, 0) | k (2, 0, 1) |
| | | | | k (3, 0, 0) |
| | | | | k (0, 0, 3) |

In the case that the locality differs with the erasure pattern, the digits in parentheses in Table 1 indicate the numbers of erasures in the last-level data subsets. In Table 1, scheme (a) may correspond to the codeword 210, scheme (b) may correspond to the codeword 220, scheme (c) may correspond to the codeword 230, scheme (d) may correspond to the codeword 240, scheme (e) may correspond to the codeword 250, and scheme (f) may correspond to the codeword 260.

To further illustrate, the codeword 250 of FIG. 2 includes four data subsets (the subsets 253, 255, 257, and 259) in the last level. In this example, if three erasures occur and the erasures are associated with different last-level subsets (denoted by (1, 1, 1, 0) in Table 1), then Table 1 indicates that 3 k/4 data and parity symbols may be accessed for recovery of the three erasures.

In scheme (b), by splitting data symbols into two subsets and dividing $p_0$ into two partial parity symbols, a single erasure may be recoverable by accessing k/2−1 data symbols and one parity symbol. Locality for correcting two or more erasures may correspond to k. By including more subsets and/or by allocating more parities to lower level subsets, locality for correcting two or more erasures may be improved, as indicated in schemes (c)-(f).

Erasures may be corrected using only the symbols in the smallest subsets with sufficient erasure-correction capability. To illustrate, if two erasures in $S_{0,0}$ and one erasure in $S_{0,1}$ occur in connection with scheme (e), then the erasure in $S_{0,1}$ may be corrected using $p_{0,0,1}$ and other data symbols in $S_{0,1}$. After recovering the erasure in $S_{0,1}$, erasures in $S_{0,0}$ may be corrected using $p_{0,0,0}$, $p_{1,0}$, and other data symbols in $S_{0,0}$ and $S_{0,1}$. In this example, locality may correspond to k/4−1+1+k/4−2+1+1=k/2.

Scheme (f) illustrates an example of "unequal" protection. "Unequal" protection may be applied to increase protection for one or more devices associated with higher probability of failure as compared to one or more other devices. In an illustrative example, data symbols of the first subset 262 are stored at one or more devices of the memory device 103 that have a first reliability, and data symbols of the second subset 264 are stored at one or more devices of the memory device 103 that have a second reliability that is less than the first reliability.

In some cases, a technique in accordance with the disclosure may be used to correct more erasures than t. For example, seven erasures with an erasure pattern (3, 1, 2, 1) (e.g., where three erasures occur in the first subset 253, one erasure occurs in the subset 255, two erasures occur in the subset 257, and one erasure occurs in the subset 259) may be corrected in accordance with scheme (e).

FIG. 2 shows certain examples that may be used based on probability and distribution of erasures. Although the examples of FIG. 2 correspond to t=3, in other examples t≥4.

Certain illustrative encoder and decoder implementation architectures may be configured to operate in accordance with Vandermonde matrices. For Vandermonde matrices, the parity computation may be performed based on:

$$p_i = \sum_{j=0}^{k-1} \alpha^{ij} d_j.$$

To increase throughput, multiple data symbols to be written to a device of the memory device 103 may be processed in each clock cycle. The multiple data symbols may belong to different codewords (e.g., the codeword 140 and one or more other codewords), and multiple encoders (e.g., the encoder 134 and one or more other encoders) may be used, where one encoder processes one data symbol at a time. Instead of a general finite field multiplier, a "constant" multiplier (e.g., the multiplier circuit 404) may be used to reduce a number of logic gates. To reduce encoder complexity, Horner's rule is applied so that:

$$p_i = \alpha^i ( \ldots (\alpha^i(\alpha^i d_{k-1}+d_{k-2})+d_{k-3} \ldots +d_1)+d_0.$$

Accordingly, an encoder (e.g., the encoder 134) may be implemented using a feedback loop (e.g., as illustrated by FIG. 4). To enable parity splitting operations, the register 406 may be reset (e.g., using the reset signal 410) when data of the next subset is input to the encoder 134 (e.g., at the adder circuit 402). In this case, the lower-level parities associated with $p_i$ (i>0) may no longer sum to $p_i$. Accordingly, a decoding process may include multiplying the lower-level parities with $\alpha^{is}$, where s is the total cardinalities of the previous subsets in the same level as the current subset. For example, if each last-level subset has k/3 symbols in scheme (f) of Table 1, then the encoder 134 may be reset at clock cycle 0, at clock cycle k/3, and at clock cycle 2 k/3 to generate $p_{0,0,0}$, $p_{0,0,1}$, and $p_{0,1}$. The first MA circuit 502 (or another circuit, such as another MA circuit that operates in parallel with the first MA circuit 502) may be reset at clock cycle 0 and at clock cycle 2 k/3 to generate $p_{1,0}$ and $p_{1,1}$. In this example, $$p_1 = p_{1,0} + \alpha^{2k/3} p_{1,1}.$$

During a decoding process, if data to be decoded includes last-level subsets with one erasure, the erasure may be first recovered by XORing the other data symbols and the partial $p_0$ for the same subset. Then contributions of the last-level subsets may be added to the parities to recover the other erasures. This single-erasure pre-correction may reduce locality as compared to other techniques. For example, without pre-correction, a decoding process in accordance with scheme (e) of Table 1 to correct erasures having the pattern (2, 1, 0, 0) may include accessing $p_{0,0,0}$, $p_{0,0,1}$, $p_{1,0}$, $p_2$ and each other (non-erased) data symbol. In this example, the locality may be k+1.

FIG. 5 illustrates an example decoder architecture for t=4. In the example of FIG. 5, erasures may be located at positions w, x, y, and z, and $$q_i = p_i + \Sigma_{j \neq w,x,y,z} \alpha^{ij} d_j \text{ for } 0 \leq i \leq 3.$$

The values $q_i$ may be computed by the MA circuits and the parity integration and pre-correction circuit 506. The MA circuits of FIG. 5 may be as described with reference to the encoder 134 of FIG. 4, except that $d_j$ may be set to zero when j=w, x, y or z. The LUT 512 may store $\alpha^j$ for $0 \leq j < k$, and the coefficient generator 514 may compute all coefficients involving powers of $\alpha$ used by the decoder 136. The parity integration and pre-correction circuit 506 may include three copies of the circuit 520 that connect to $MA_i$ (i=1, 2, 3). The data subsets may be processed out-of-order during decoding due to the parity integration and pre-correction circuit 506.

After each subset is processed at the decoder 136, the parity integration and pre-correction circuit 506 may add the output of $MA_i$ to the partial parity of the same subset, and the sum may be multiplied by $\alpha^{is}$. Such products from different subsets may be accumulated by the adder-register loop of the circuit 520 to generate $q_i$ (i=1, 2, 3). The partial parities of $p_0$ may be added up by a XOR operation performed by the decoder 136, such as by "sharing" the first MA circuit 502 ($MA_0$).

A recovered erasure in a subset (e.g., $d_w$) may be provided at the output of the first MA circuit 502. The recovered erasure may be multiplied with $\alpha^{iw}$ and added to an "intermediate" value, $q_i$ (i=1, 2, 3) by sharing the multipliers and feedback loops in the parity integration and pre-correction circuit 506.

The erasures may be recovered based on linear equations. A device that operates based on properties of the Vandermonde matrix may enable simplification of certain operations. For example, $d_w$, $d_x$, $d_y$, and $d_z$ may be expressed as:

$$\begin{cases} d_z = \dfrac{\alpha^{w+x+y} q_0 + (\alpha^{w+x} + \alpha^{w+y} + \alpha^{x+y}) q_1 + (\alpha^w + \alpha^x + \alpha^y) q_2 + q_3}{(\alpha^w + \alpha^z)(\alpha^x + \alpha^z)(\alpha^y + \alpha^z)} \\ d_y = \dfrac{\alpha^{w+x} q_0 + (\alpha^w + \alpha^x) q_1 + q_2 + (\alpha^w + \alpha^z)(\alpha^x + \alpha^z) d_z}{(\alpha^w + \alpha^y)(\alpha^x + \alpha^y)} \\ d_x = \dfrac{\alpha^w q_0 + q_1 + (\alpha^w + \alpha^y) d_y}{(\alpha^w + \alpha^x)} \\ d_w = q_0 + d_x + d_y + d_z \end{cases}$$
(Equation 2)

If three erasures occur, the decoder 136 may be configured to recover the erasures by performing operations based on the last three formulas in Equation 2 (e.g., without the product terms involving $d_z$). If two erasures occur, the decoder 136 may be configured to recover the erasures by performing operations based on the last two formulas of Equation 2 (e.g., without the product terms involving $d_z$ and $d_y$). The decoder 136 may be configured to recover a single erasure by performing operations based on $d_w = q_0$.

In some examples, erasures belong to different drives and are written back at different clock cycles. In this case, pipelining of operations may be implemented without causing additional latency. Two or more coefficients of Equation 2 may be determined in parallel with $q_i$. For example, determination of $q_i$ may be performed in parallel with determining coefficients by the coefficient generator 514. Because determination of $q_i$ may use a relatively large number of clock cycles, a relatively small number of logic circuits (e.g., multiplier circuits, adder circuits, and registers) may be implemented in the coefficient generator 514 using a time-multiplexing technique.

Although various components depicted herein are illustrated as block components and described in general terms, such components may include one or more microprocessors, state machines, or other circuits configured to enable such components to perform one or more operations described herein. For example, the erasure correcting code engine 132 may represent physical components, such as hardware controllers, state machines, logic circuits, or other structures, to enable the controller 130 to encode and decode partial parity symbols of an erasure correcting code.

Alternatively or in addition, the erasure correcting code engine 132 may be implemented using a microprocessor or microcontroller programmed to perform a hash operation. In a particular embodiment, the erasure correcting code engine 132 includes a processor executing instructions (e.g., firmware) that are stored at a drive of the memory device 103. Alternatively, or in addition, executable instructions that are executed by the processor may be stored at a separate memory location that is not part of the memory device 103, such as at a read-only memory (ROM) of the controller 130.

It should be appreciated that one or more operations described herein as being performed by the controller 130 may be performed at the memory device 103. As an illustrative example, in-memory ECC operations (e.g., encoding operations and/or decoding operations) may be performed at the memory device 103 alternatively or in addition to performing such operations at the controller 130.

The device 102 may be coupled to, attached to, or embedded within one or more accessing devices, such as within a housing of the device 180. For example, the device 102 may be embedded within the device 180 in accordance with a Joint Electron Devices Engineering Council (JEDEC) Solid State Technology Association Universal Flash Storage (UFS) configuration. To further illustrate, the device 102 may be integrated within an electronic device (e.g., the device 180), such as a mobile telephone, a computer (e.g., a laptop, a tablet, or a notebook computer), a music player, a video player, a gaming device or console, an electronic book reader, a personal digital assistant (PDA), a portable navigation device, or other device that uses internal non-volatile memory.

In one or more other implementations, the device 102 may be implemented in a portable device configured to be selectively coupled to one or more external devices, such as a host device. For example, the device 102 may be removable from the device 180 (i.e., "removably" coupled to the device 180). As an example, the device 102 may be removably coupled to the device 180 in accordance with a removable universal serial bus (USB) configuration.

The device 180 may correspond to a mobile telephone, a computer (e.g., a laptop, a tablet, or a notebook computer), a music player, a video player, a gaming device or console, an electronic book reader, a personal digital assistant (PDA), a portable navigation device, another electronic device, or a combination thereof. The device 180 may communicate via a controller, which may enable the device 180 to communicate with the device 102. The device 180 may operate in compliance with a JEDEC Solid State Technology Association industry specification, such as an embedded MultiMedia Card (eMMC) specification or a Universal Flash Storage (UFS) Host Controller Interface specification. The device 180 may operate in compliance with one or more other specifications, such as a Secure Digital (SD) Host Controller specification as an illustrative example. Alternatively, the device 180 may communicate with the device 102 in accordance with another communication protocol. In some implementations, the device 102 may be integrated within a network-accessible data storage system, such as an enterprise data system, an NAS system, or a cloud data storage system, as illustrative examples.

In some implementations, the device 102 may include a solid state drive (SSD). The device 102 may function as an embedded storage drive (e.g., an embedded SSD drive of a mobile device), an enterprise storage drive (ESD), a cloud storage device, a network-attached storage (NAS) device, or a client storage device, as illustrative, non-limiting examples. In some implementations, the device 102 may be coupled to the device 180 via a network. For example, the network may include a data center storage system network, an enterprise storage system network, a storage area network, a cloud storage network, a local area network (LAN), a wide area network (WAN), the Internet, and/or another network.

To further illustrate, the device 102 may be configured to be coupled to the device 180 as embedded memory, such as in connection with an embedded MultiMedia Card (eMMC®) (trademark of JEDEC Solid State Technology Association, Arlington, Va.) configuration, as an illustrative example. The device 102 may correspond to an eMMC device. As another example, the device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The device 102 may operate in compliance with a JEDEC industry specification. For example, the device 102 may operate in compliance with a JEDEC eMMC specification, a JEDEC Universal Flash Storage (UFS) specification, one or more other specifications, or a combination thereof.

A memory (e.g., a drive of the memory device 103) may include a resistive random access memory (ReRAM), a flash memory (e.g., a NAND memory, a NOR memory, a single-level cell (SLC) flash memory, a multi-level cell (MLC) flash memory, a divided bit-line NOR (DINOR) memory, an AND memory, a high capacitive coupling ratio (HiCR) device, an asymmetrical contactless transistor (ACT) device, or another flash memory), an erasable programmable read-only memory (EPROM), an electrically-erasable programmable read-only memory (EEPROM), a read-only memory (ROM), a one-time programmable memory (OTP), another type of memory, or a combination thereof. In a particular embodiment, the device 102 is indirectly coupled to an accessing device (e.g., the device 180) via a network. For example, the device 102 may be a network-attached storage (NAS) device or a component (e.g., a solid-state drive (SSD) component) of a data center storage system, an enterprise storage system, or a storage area network.

Semiconductor memory devices include volatile memory devices, such as dynamic random access memory ("DRAM") or static random access memory ("SRAM") devices, non-volatile memory devices, such as resistive random access memory ("ReRAM"), magnetoresistive random access memory ("MRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in they direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional exemplary structures described but cover all relevant memory structures within the spirit and scope of the disclosure as described herein and as understood by one of skill in the art. The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
   receiving data that includes a set of data symbols;
   determining multiple proper subsets of the set of data symbols, the multiple proper subsets including a first proper subset of the set of data symbols and a second proper subset of the set of data symbols, wherein the first proper subset includes a third proper subset of the first proper subset and a fourth proper subset of the first proper subset; and
   generating a set of parity symbols based on the set of data symbols using an erasure correcting code, wherein the set of parity symbols includes a first parity symbol that is generated based on the first proper subset and further includes a second parity symbol that is generated based on the third proper subset,
   wherein the first parity symbol enables recovery of a first data symbol of the first proper subset independently of the second proper subset, and
   wherein the second parity symbol enables recovery of a second data symbol of the third proper subset independently of the fourth proper subset.

2. The method of claim 1, further comprising sending the set of data symbols and the set of parity symbols to one or more devices of a distributed storage system (DSS).

3. The method of claim 1, wherein each data symbol of the second proper subset is excluded from the first proper subset, and further comprising generating an erasure correcting codeword based on the first proper subset and the second proper subset.

4. The method of claim 1, further comprising generating, based on the fourth proper subset, a third parity symbol of the set of parity symbols, wherein the second parity symbol and the third parity symbol correspond to partial parity symbols of the first parity symbol.

5. An apparatus comprising:
   an adder circuit of an encoder, the adder circuit configured to receive a first proper subset of a set of data symbols;
   a multiplier circuit of the encoder, the multiplier circuit coupled to the adder circuit; and
   a register coupled to the adder circuit and the multiplier circuit, the register configured to output a first parity symbol responsive to the adder circuit and based on the first proper subset, to receive a reset signal to reset a state of the register prior to processing of a second proper subset of the set of data symbols by the adder circuit to enable separate encoding of multiple proper subsets of the set of data symbols, and to output a second parity symbol responsive to the adder circuit and based on the second proper subset,
   wherein the first parity symbol enables recovery of a first data symbol of the first proper subset independently of the second proper subset.

6. The apparatus of claim 5, wherein a reset input of the register is configured to receive the reset signal to reset the state of the register to initialize the register for processing of the second proper subset of the set of data symbols.

7. A method comprising:
in response to an erasure event associated with a first data symbol of a set of data symbols, wherein the first data symbol and a second data symbol of the set of data symbols are included in a first proper subset of the set of data symbols, and wherein the second data symbol is included in a second proper subset of the set of data symbols:
- receiving a third data symbol associated with the second proper subset;
- receiving a first parity symbol associated with the first proper subset;
- receiving a second parity symbol associated with the second proper subset;
- recovering the second data symbol based on the third data symbol and the second parity symbol; and
- recovering the first data symbol based on the second data symbol and the first parity symbol.

8. The method of claim 7, wherein recovering the first data symbol includes performing an exclusive-or (XOR) operation based at least in part on the second data symbol and the first parity symbol.

9. The method of claim 8, wherein the XOR operation is based further on an exponentiation of a coefficient of a parity check matrix associated with the first parity symbol.

10. The method of claim 7, further comprising accessing information in response to the erasure event to determine that the first data symbol is associated with the second data symbol.

11. The method of claim 10, wherein the information indicates that the first data symbol is included in multiple proper subsets of the set of data symbols, and further comprising selecting the second data symbol in response to determining that the first proper subset is of a lower cardinality than other proper subsets of the multiple proper subsets.

12. An apparatus comprising:
- means for performing a first multiply-add (MA) operation at a decoder associated with an erasure correcting code to generate a first output based on a first data symbol;
- means for performing a second MA operation at the decoder to generate a second output based on the first data symbol; and
- parity integration and pre-correction means for accessing the first output and for updating the second output based on the first output.

13. The apparatus of claim 12, wherein the parity integration and pre-correction means includes means for selecting a corrected data value of the first output and for updating the second output by inserting the corrected data value at the second output.

14. The apparatus of claim 12, further comprising means for performing a multiplexing operation.

15. The apparatus of claim 14, wherein the means for performing the multiplexing operation is configured to select one of a data value and a partial parity symbol and to provide the data value or the partial parity symbol to the means for performing the first MA operation.

16. The apparatus of claim 12, further comprising means for determining a decoding order of subsets of a plurality of data symbols that includes the first data symbol.

* * * * *